US011422158B2

(12) United States Patent
Kim et al.

(10) Patent No.: US 11,422,158 B2
(45) Date of Patent: Aug. 23, 2022

(54) TEST BOARD AND TEST APPARATUS INCLUDING A MULTI-TYPE FLUID SUPPLIER FOR TESTING ELECTRONIC APPARATUSES HAVING SEMICONDUCTOR DEVICES

(71) Applicant: SAMSUNG ELECTRONICS CO., LTD., Suwon-si (KR)

(72) Inventors: Hyeju Kim, Asan-si (KR); Youngchul Lee, Asan-si (KR); Jaecheong Lee, Asan-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 0 days.

(21) Appl. No.: 16/943,632

(22) Filed: Jul. 30, 2020

(65) Prior Publication Data
US 2021/0172979 A1 Jun. 10, 2021

(30) Foreign Application Priority Data

Dec. 6, 2019 (KR) .................... 10-2019-0161705

(51) Int. Cl.
*G01R 1/44* (2006.01)
*G01R 31/28* (2006.01)
(52) U.S. Cl.
CPC ........... *G01R 1/44* (2013.01); *G01R 31/2849* (2013.01)
(58) Field of Classification Search
None
See application file for complete search history.

(56) References Cited

U.S. PATENT DOCUMENTS

| | | | |
|---|---|---|---|
| 7,502,326 B2 | 3/2009 | Evans | |
| 7,873,885 B1 | 1/2011 | Shin et al. | |
| 8,330,482 B2* | 12/2012 | Scocchetti | ......... G01R 31/2874 324/756.07 |
| 9,285,416 B2 | 3/2016 | Lee et al. | |
| 9,995,787 B2 | 6/2018 | Lee et al. | |
| 2009/0071524 A1* | 3/2009 | Son | ................... H01L 21/67109 136/203 |
| 2013/0135000 A1 | 5/2013 | Song et al. | |
| 2014/0262149 A1 | 9/2014 | Merrow | |
| 2018/0246164 A1 | 8/2018 | Lee et al. | |
| 2018/0313890 A1 | 11/2018 | Wolff | |
| 2021/0018559 A1* | 1/2021 | Tsai | ....................... G11C 29/44 |

FOREIGN PATENT DOCUMENTS

KR  10-2001-0054658  7/2001
KR  10-1767663  8/2017

* cited by examiner

*Primary Examiner* — Douglas X Rodriguez
(74) *Attorney, Agent, or Firm* — F. Chau & Associates, LLC (57) ABSTRACT

A test board and a test apparatus having the same are disclosed. The test board includes a base plate including a connector and a plurality of mounting areas in a matrix shape having a mounting row in a first direction and a mounting column in a second direction, a plurality of test units arranged on the mounting areas of the base plate and a test object is mounted in each of the mounting areas, and a fluid supplier disposed on the base plate and supplying a test fluid to each of the test units having a test temperature and a supplementary fluid to the test object to reduce a temperature difference between an actual temperature of the test object and the test temperature such that the actual temperature of the test objects is substantially below the test temperature.

17 Claims, 5 Drawing Sheets

TEST BOARD AND TEST APPARATUS INCLUDING A MULTI-TYPE FLUID SUPPLIER FOR TESTING ELECTRONIC APPARATUSES HAVING SEMICONDUCTOR DEVICES

CROSS-REFERENCE TO RELATED APPLICATION

This application claims priority under 35 U.S.C § 119 to Korean Patent Application No. 10-2019-0161705 filed on Dec. 6, 2019 in the Korean Intellectual Property Office (KIPO), the disclosure of which is herein incorporated by reference in its entirety.

TECHNICAL FIELD

Exemplary embodiments of the present disclosure relate generally to a test board and a test apparatus for testing electronic apparatuses having semiconductor devices, and more particularly, to a test board for conducting a burn-in test to electronic apparatuses mounted on array printed circuit boards (PCBs) and a test apparatus having the test board.

DISCUSSION OF THE RELATED ART

Various electronic apparatuses having semiconductor devices are popular in various fields due to the rapid development of the semiconductor devices. For example, non-volatile memory devices (e.g., flash memory devices) have been used as data storage devices such as solid state drive (SSD) apparatuses.

According to some conventional SSD apparatuses, a printed circuit board (PCB) may be provided for a base board and at least an integrated circuit (IC) device, at least a volatile memory device and at least a non-volatile memory device may be mounted on the PCB. The IC device may be configured as a controller and the volatile memory device such as a DRAM device may be configured as a buffer memory device. A plurality of the non-volatile memory devices (e.g., the flash memory devices) may be provided as a large capacity data storage system.

After the completion of a manufacturing process for an SSD apparatus, the SSD apparatus may be loaded into a burn-in test chamber to test its reliability and endurance. A conventional burn-in test apparatus may include a test chamber having a test space that is selectively closed by a door and an array PCB on which a plurality of the SSDs under test are mounted. The array PCB may be installed into the test chamber like a drawer, and thus the array PCB may be drawn into the test space when initiating the burn-in test or drawn out of the test space when the burn-in test is completed. When the array PCB is positioned in the test chamber, a hot fluid or a cold fluid may selectively flow in the test space during a hot burn-in test or a cold burn-in test.

The cold burn-in test is conducted on the SSDs which are mounted on the array PCB. The operational heat generated from each SSD may be radiated into the test space, and thus the temperature of the test space may not be easily maintained by the cold fluid at a certain test temperature. In addition, it usually takes a longer time to maintain the test temperature of the cold burn-in test in the test space. In contrast, a test temperature of the hot burn-in test is generally much higher than the temperature of the operational heat generated from each SSD, so the test temperature may be sufficiently maintained in the test space by the hot fluid.

In addition, the temperature uniformity of the SSDs tends to deteriorate in the cold burn-in test due to heat transfer between the heat generated from each SSD and the heat of the cold fluid. This phenomenon may cause the decrease in reliability of the cold burn-in test.

SUMMARY

Some exemplary embodiments of the present inventive concept provide a test board on which a plurality of test objects is mounted, where the temperature uniformity among the test objects may be increased in a shorter time.

Other exemplary embodiments of the inventive concept provide a test apparatus having the above test board.

According to an exemplary embodiment of the inventive concept, a test board may include a base plate comprising at least a connector and a plurality of mounting areas in a matrix shape having at least a mounting row in a first direction and at least a mounting column in a second direction substantially perpendicular to the first direction, a plurality of test units arranged on the mounting areas of the base plate, respectively, and a test object may be mounted in each of the mounting areas for an operational test, and a fluid supplier disposed on the base plate and supplying a test fluid to each of the test units for the operational test having a test temperature and a supplementary fluid to the test object to reduce a temperature difference between an actual temperature of the test object and the test temperature such that the actual temperature of the test objects may be substantially below the test temperature.

According to an exemplary embodiment of the inventive concept, a test apparatus may include a test head including electronic instruments that may generate a test signal for testing the test objects and may detect and analyze operational signals generated from the test objects in response to the test signal, a plurality of test boards on each of which the test objects may be mounted in a matrix shape, each of the test boards may include a connector and may supply a supplementary fluid for reducing a temperature difference of the test objects as well as a test fluid for conducting the operational test, and a test chamber including a connector plate that may be connected to the test head and a plurality of the connectors of the test boards and receiving a plurality of the test boards such that the operational test may be conducted on each of the test objects under a test temperature.

In such a case, the test board may include a base plate including the connector and a plurality of mounting areas in a matrix shape having at least a mounting row in a first direction and at least a mounting column in a second direction substantially perpendicular to the first direction, a plurality of test units arranged on the mounting areas of the base plate, respectively, and a test object may be mounted in each of the mounting areas such that each of the plurality of the test units may include a mounting frame disposed in the mounting area of the base plate and holding the test object and a socket arranged on the base plate and is connected to the connector and the test object, and a fluid supplier disposed on the base plate and supplying a test fluid to each of the test units for the operational test having the test temperature and a supplementary fluid to the test object to reduce a temperature difference between an actual temperature of the test object and the test temperature such that the temperature of the test objects may be substantially below the test temperature. The fluid supplier may include a supplementary fluid line arranged on the base plate and extending in the first direction alternately with the mounting row such that the supplementary fluid may be supplied onto the test object in the second direction from the supplementary fluid line as a slant flow slanted with respect to the test object, and a main fluid line arranged on the base plate and extending in the second direction such that the test fluid may be supplied onto the test object in the first direction from the main fluid line as a horizontal flow substantially horizontal with respect to the test object.

According to an exemplary embodiment of the inventive concept, the test board on which a plurality of test objects is mounted may be stacked on the test chamber and the cold test may be conducted in the test chamber as well as the hot test. The test fluid may flow over the test objects and may be circulated in the test chamber by a circulator.

The test object may include an array circuit board and a plurality of electronic apparatuses on the array circuit board and a temperature sensor may be arranged on the array circuit board. The actual temperature may be detected by the temperature sensor and the temperature difference between the actual temperature and the test temperature may be automatically obtained along with the test object. Then, the test fluid may be intensively injected onto the test object until the temperature difference is rapidly reduced to be within the allowable range or is eliminated, thereby increasing the efficiency and the reliability of the operational test conducted on the electronic apparatuses.

BRIEF DESCRIPTION OF THE DRAWINGS

The above and other features of the inventive concept will become more apparent by describing in detail exemplary embodiments thereof with reference to the accompanying drawings, in which.

DETAILED DESCRIPTION OF THE EMBODIMENTS

Herein, it will be understood that when an element or layer is referred to as being "on", "connected to" or "coupled to" another element or layer, it can be directly on, connected or coupled to the other element or layer, or intervening elements or layers may be present.

Like reference numerals may refer to like elements throughout this specification. In the figures, the thicknesses of layers, films or regions may be exaggerated for clarity.

As used herein, the singular forms, "a", "an" and "the" are intended to include the plural forms as well, unless the context clearly indicates otherwise.

Figure 1:
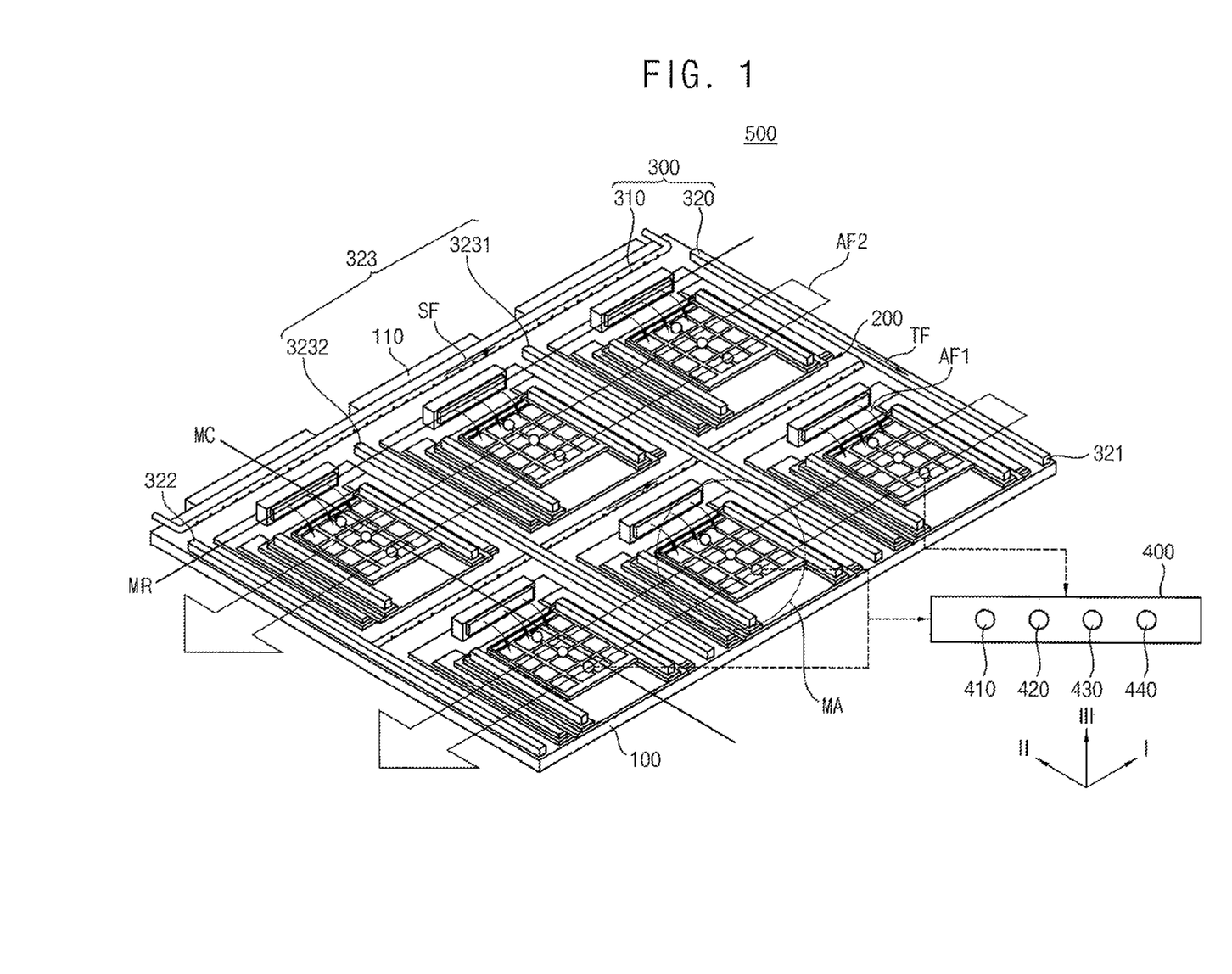
FIG. 1 is a perspective view illustrating a test board for testing a plurality of test objects according to an exemplary embodiment of the inventive concept.
Figure 2:
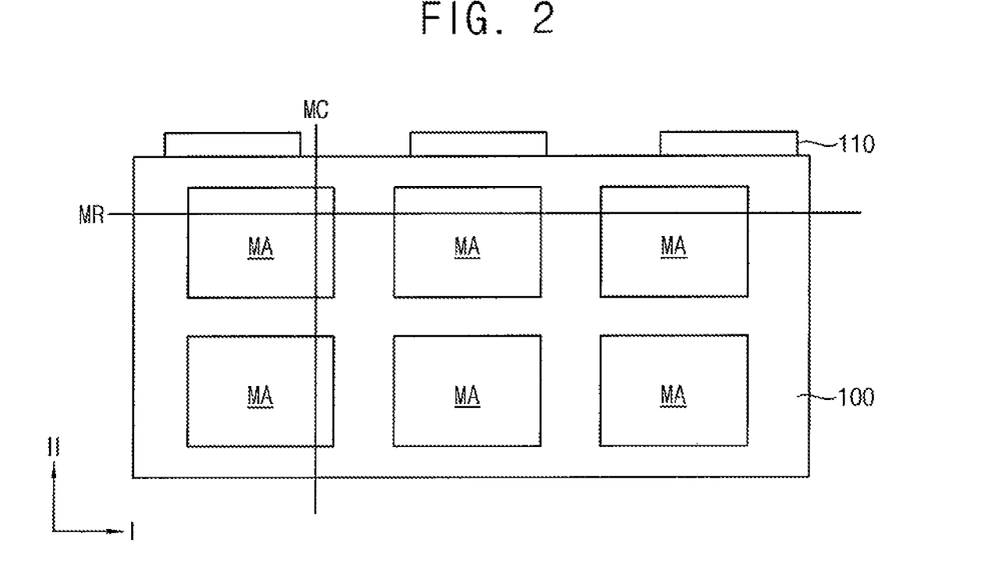
FIG. 2 is a plan view illustrating a base plate of the test board shown in FIG. 1 according to an exemplary embodiment of the inventive concept.

FIG. 1 is a perspective view illustrating a test board for testing a plurality of test objects according to an exemplary embodiment of the inventive concept. FIG. 2 is a plan view illustrating a base plate of the test board shown in FIG. 1.

Figure 3:
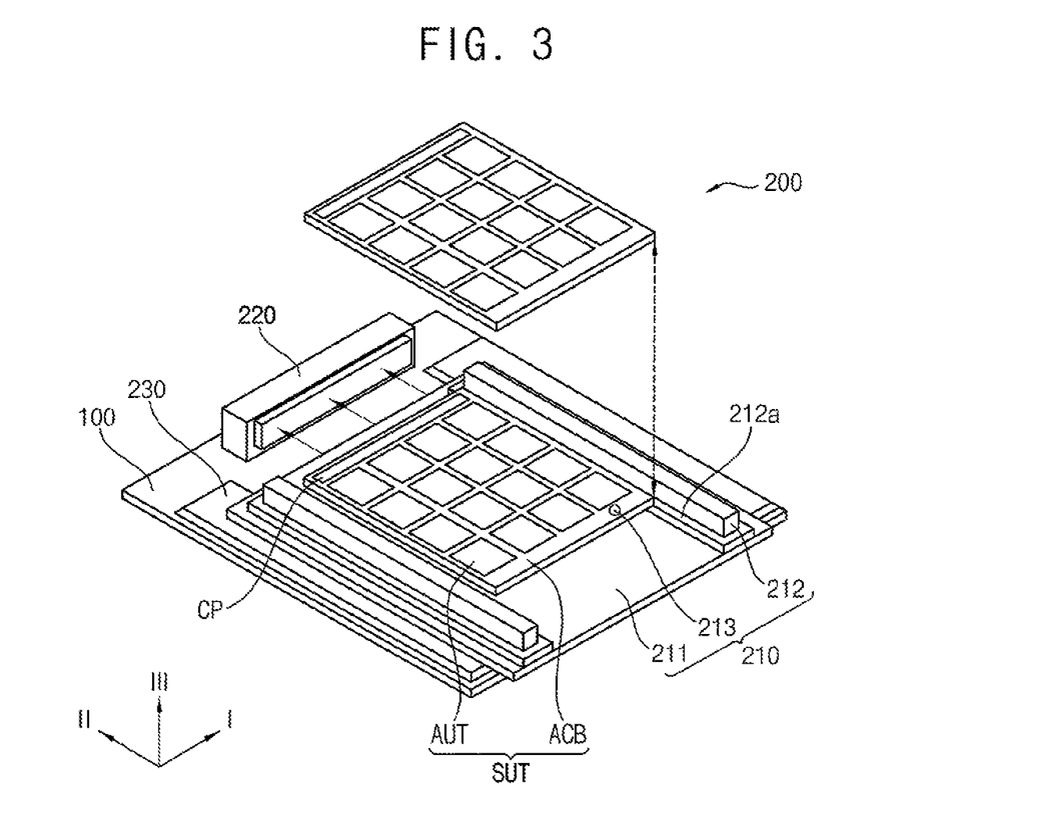
FIG. 3 is a perspective view illustrating a test unit of the test board shown in FIG. 1 according to an exemplary embodiment of the inventive concept.
Figure 4A:
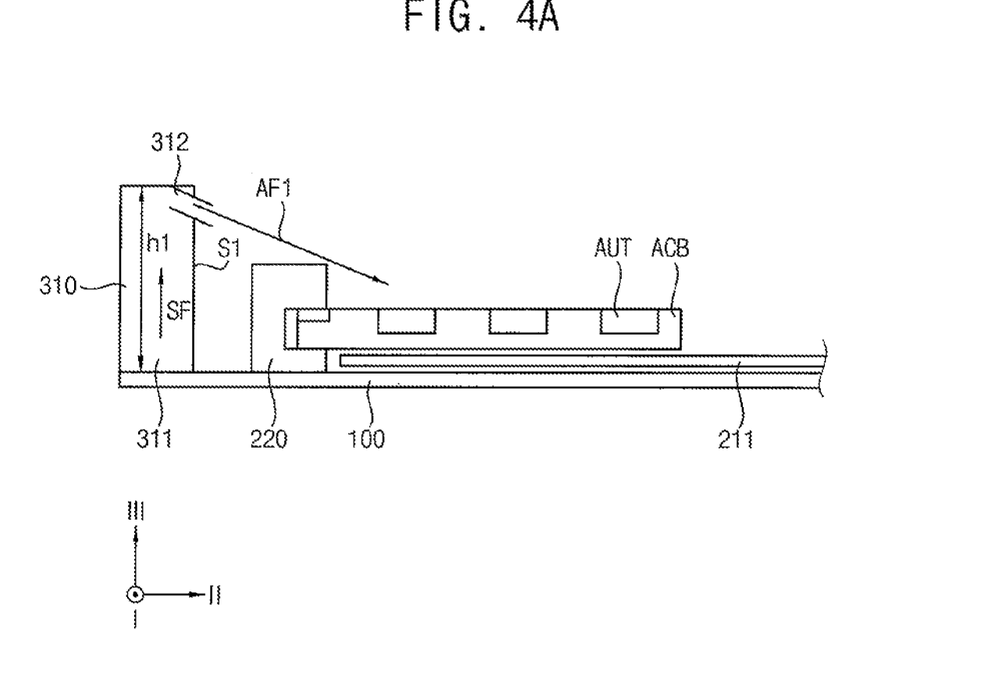
FIG. 4A is a cross-sectional view illustrating the supplementary fluid line of the test board shown in FIG. 1 according to an exemplary embodiment of the inventive concept.

Referring to FIG. 1, according to an exemplary embodiment of the present inventive concept, a test board 500 for testing the test objects may include a base plate 100, a plurality of test units 200 arranged on the base plate 100 in a matrix shape and a plurality of the test objects SUT (as shown in FIG. 3) mounted on each test unit 200 for an operational test, a fluid supplier 300 for supplying a test fluid TF and a supplementary fluid SF (as shown in FIG. 4A) to the test objects SUT for the operational test, and a fluid controller 400 detecting an actual temperature of each of the test objects SUT and controlling the flow of the supplementary fluid SF. The fluid supplier 300 may reduce a temperature difference among the test objects SUT. Herein, each test object may undergo the operational test on the test board 500 as a substrate structure, and thus the test object may denote a substrate object under test and may be referred to as SUT. A plurality of electronic apparatuses may be disposed in a single test object SUT and a plurality of the test objects SUT may be mounted on the test board 500.

For example, the base plate 100 may include at least a connector 110 at a side surface of the base plate 100 and a plurality of mounting areas MA on a top surface of the base plate 100. The mounting areas MA may be arranged in a matrix shape and be configured so that at least a mounting row MR is arranged in a first direction I and at least a mounting column MC is arranged in a second direction II substantially perpendicular to the first direction I.

The base plate 100 may include an insulation plate for preventing the interference between test signals to the test objects SUT and operational signals from the test objects SUT. In an example, the base plate 100 may have such rigidity and stiffness that the deformation of the base plate 100 due to the test objects SUT may be sufficiently prevented in the operational test. In an exemplary embodiment, the base plate 100 may include an insulative plastic plate or an insulative glass plate.

The connector 110 may be installed at the side surface of the base plate 100 in the first direction I. The connector 110 may include a contact terminal on which conductive lines may be printed and the connector 110 may be connected to a contact slot of a test apparatus, as described in detail afterwards. Thus, the test signals may be transmitted to the test objects SUT from the test apparatus sequentially via the contact slot and the connector 110. In addition, the operational signals may be transmitted from the test objects SUT to the test apparatus in response to the test signals sequentially via the connector 110 and the contact slot.

A plurality of the mounting areas MA may be arranged on the top surface of the base plate 100 in the first and the second directions I and II. A plurality of the test objects SUT may be mounted on each of the mounting areas MA, and thus a size of the mounting area MA may vary according to an overall size of the test objects SUT. In an exemplary embodiment of the inventive concept, the size or area of each mounting area MA may vary according to the size of each of the test objects SUT. For example, if the overall size of the test objects SUT is relatively large, the size of the mounting area MA may also be relatively large.

Thus, the plurality of mounting areas MA may be arranged in a matrix shape having at least a mounting row MR in the first direction I, at least a mounting column MC in the second direction II, and a plurality of the test objects SUT may be mounted on each of the mounting areas MA.

Referring to FIG. 2, in an exemplary embodiment of the inventive concept, each mounting area MA may be provided as a 2×3 matrix. However, the mounting area MA may be configured to various matrices of different dimensions according to the requirements and test capacity of a test apparatus having the test board 500.

The test unit 200 may be disposed in each of mounting area MA and may conduct signal communication with the test apparatus through the connector 110.

FIG. 3 is a perspective view illustrating the test unit of the test board shown in FIG. 1.

Referring to FIG. 3, the test unit 200 may include a mounting frame 210 arranged in the mounting area MA of the base plate 100. The mounting frame 210 may hold the test object SUT and a socket 220 may connect the mounting frame 210 to the base plate 100 so that the test object SUT secured to the mounting frame 210 may be electrically connected to the connector 110.

In an exemplary embodiment of the inventive concept, the mounting frame 210 may include a support plate 211 on the base plate 110 and a holding member 212 shaped into a slender bar extending in the second direction II at a peripheral portion of the support plate 211. The holding member 212 may hold the test object SUT. The mounting frame 210 may also include a temperature sensor 213 which is provided with the test objects SUT.

The support plate 211 may be in parallel with the base plate 100, and thus most of the mounting areas MA of the base plate 100 may be covered by the support plate 211. In addition, the support plate 211 may be divided into a plurality of holding sections corresponding to the mounting areas MA, respectively. Each holding section of the support plate 211 may be referred to as the holding member 212. The holding member 212 may be disposed on a peripheral portion of the support plate 211 and be shaped into a slender member extending in the second direction II. A pair of the holding members 212 may be disposed at both peripheral portions of the support plate 211 and may be spaced apart from each other in the first direction I. Thus, a mounting space may be provided on the support plate 211 between the pair of the holding members 212. The test object SUT may be received in the mounting space and be secured to the holding members 212. The holding members 212 may include a guide bar 212a to guide the test object SUT into the mounting space.

For example, the test object SUT may include an array circuit board ACB and a plurality of electronic apparatuses AUT under test on the array circuit board ACB. The electronic apparatuses AUT may be electrically connected to the array circuit board ACB and the array circuit board ACB may be selectively connected to the socket 220. The electronic apparatuses AUT may include various semiconductor devices that need reliability test and operational test prior to product packing. For example, the electronic apparatuses AUT may include a storage apparatus such as a solid state drive (SSD) and a logic processor in which at least a logic chip and at least a memory chip may be organized. In one example, the temperature sensor 213 may be positioned on the array circuit board ACB.

The test object SUT may be transferred into the holding members 212 of the mounting frame 210 by a robot arm (not shown) and may be positioned on the support plate 211 in the mounting space. For example, both side edge portions of the test object SUT may be positioned on the guide bar 212a that may be stepped from the support plate 211.

The test object SUT may slide on the guide bar 212a in the second direction II until a contact pad CP of the array circuit board ACB is connected to the socket 220. In this case, the test object SUT may be secured to the holding members 212 to increase the securing reliability of the test object SUT in the operational test.

In an exemplary embodiment of the inventive concept, the support plate 211 may have a size larger than an overall size of the test object SUT, and thus a rear end portion of the support plate 211 may be exposed to surroundings when the test object SUT is connected to the socket 220. For example, during the operational test of the test object SUT, the rear end portion of the support plate 211 may be exposed to surroundings. Accordingly, the operational heat generated from the test object SUT may be easily emitted to surroundings at the exposed rear portion of the support plate 211. As a result, a temperature difference between the actual temperature and the test temperature may be reduced due to the dissipation space of the operational heat generated from the test object SUT.

The socket 220 may be disposed at each side of the mounting frame 210. Thus, the test objects SUT mounted on each mounting frame 210 may be connected to the corresponding socket 220, respectively. The socket 220 may be electrically connected to each of the electronic apparatuses AUT of the test object SUT. Thus, a test signal may be transmitted to each of the electronic apparatuses AUT from the socket 220 and an operational signal generated from each of the electronic apparatuses AUT may be transmitted to the socket 220 in the corresponding mounting frame 210.

According to an exemplary embodiment of the inventive concept, a subsidiary socket 230 may be disposed between the base plate 100 and the mounting frame 210 to electrically connect the socket 220 to the connector 110. Conductive lines such as wiring lines (not shown) of the subsidiary socket 230 may extend to the connector 110 and the socket 220 through the base plate 100, so that the socket 220 may be connected to the connector 110 in spite of the insulative base plate 100. Due to the subsidiary socket 230, the mounting frame 210 may be spaced apart from the base plate 100 by a thickness of the subsidiary socket 230. In this case, a socket hole (not shown) of the socket 220 may also be lifted as high as a gap distance between the base plate 100 and the mounting frame 210.

While some exemplary embodiments of the inventive concept disclose the subsidiary socket 230 for connecting the connector 110 to the socket 220, it will be understood that any other devices may also connect the connector 110 to the socket 220. For example, the base plate 100 may include a plurality of inner electric circuits directly connecting the connector 110 to the socket 220.

The temperature sensor 213 may detect the actual temperature of the test object SUT in the operational test and may transfer the actual temperature of the test object SUT to the flow controller 400. Thus, the temperature difference between the actual temperature and the test temperature may be detected for the test object SUT.

When the temperature difference of the test object SUT is over an allowable range or threshold, the test object SUT may be determined as a temperature-deviated test object SUT and then the flow controller 400 (as shown in FIG. 1)

may control the fluid supplier 300 to inject a supplementary fluid SF to the temperature-deviated test object SUT more intensively.

In an exemplary embodiment of the inventive concept, the fluid supplier 300 may be arranged on a peripheral portion of the base plate 100 and the test fluid TF and the supplementary fluid SF may be supplied from the fluid supplier 300 to maintain the temperature of the test object SUT under the test temperature in a shorter time for the operational test.

For example, as illustrated in FIG. 1, the fluid supplier 300 may include a supplementary fluid line 310 and a main fluid line 320. The supplementary fluid line 310 may be disposed on the base plate 100 extending in the first direction I alternately with the mounting row MR. The supplementary fluid SF may be supplied onto the test objects SUT in the second direction II from the supplementary fluid line 310. The main fluid line 320 may be disposed on the base plate 100 extending in the second direction II and the test fluid TF may be supplied onto the test objects SUT in the first direction I from the main fluid line 320.

Figure 4B:
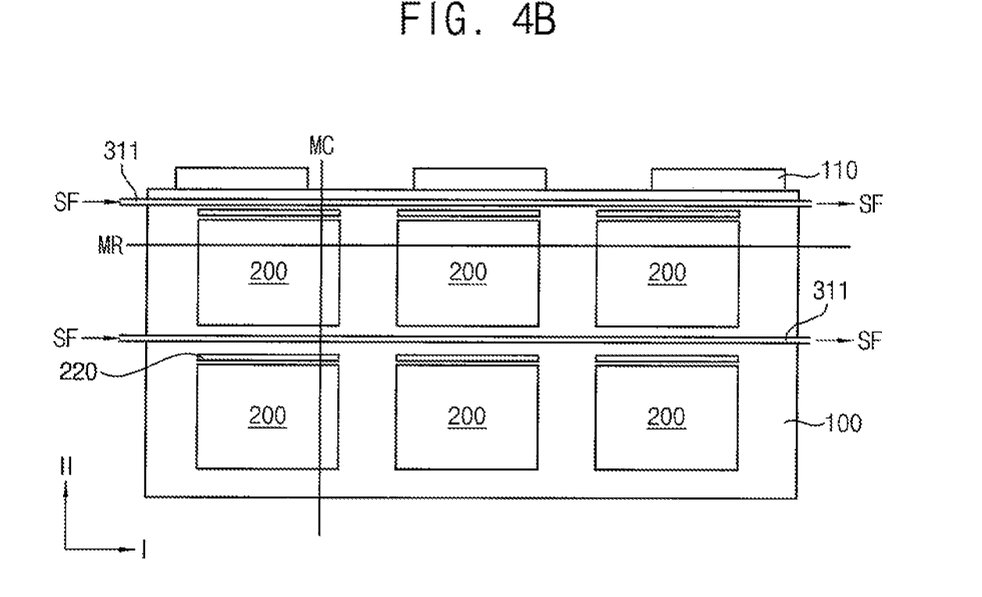
FIG. 4B is a plan view illustrating the supplementary fluid line of the test board shown in FIG. 1 according to an exemplary embodiment of the inventive concept.
Figure 4C:
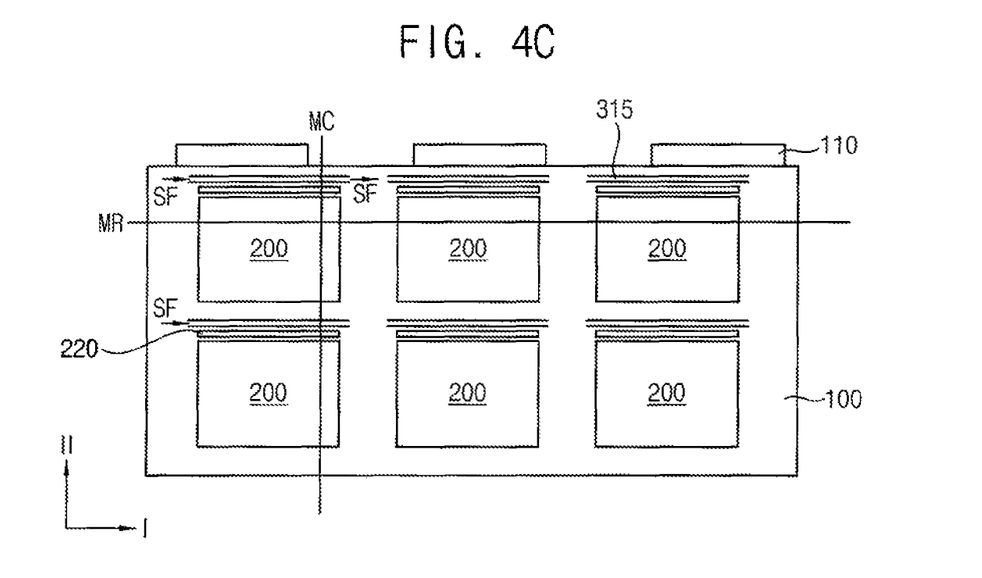
FIG. 4C is a plan view illustrating a modification of the supplementary fluid line of the test board shown in FIG. 1 according to an exemplary embodiment of the inventive concept.

FIG. 4A is a cross-sectional view illustrating the supplementary fluid line of the test board shown in FIG. 1, and FIG. 4B is a plan view illustrating the supplementary fluid line of the test board shown in FIG. 1. FIG. 4C is a plan view illustrating a modification of the supplementary fluid line of the test board shown in FIG. 1.

Referring to FIGS. 4A to 4C, the supplementary fluid line 310 may include a supply line body 311 that may be disposed at a rear side of the socket 220 with a height h1 higher than a height of the socket 220 and may be shaped into a line extending in the first direction I and a plurality of injectors 312 that may be arranged at a side surface S1 of the supply line body 311 and be slanted toward the test objects SUT.

The supplementary fluid SF may be supplied into the supplementary fluid line 310 from a fluid source storing the supplementary fluid SF and may be directly injected onto the temperature-deviated test object SUT in the second direction II through the injector 312. Thus, a temperature difference between the actual temperature and the test temperature of the temperature-deviated test object SUT may be sufficiently reduced in much shorter time.

As illustrated in FIG. 4B, the supplementary fluid line 310 may include a single supply line body 311 continuously extending in the first direction I and a plurality of supply blocks 315 that may be separately arranged at the same gap distance in the first direction I.

As illustrated in FIG. 4B, the supply line body 311 may be arranged on the base plate 100 and shaped into a slender member continuously extending in the first direction I. Thus, the supply line body 311 may be arranged as a single line shaped structure at a rear side of the sockets 220 between the neighboring mounting rows MR, and thus a plurality of the supply line bodies 311 may be arranged on the base plate 100 in the second direction II alternately with the mounting rows MR. Since the socket 220 may be disposed at each side of the mounting frame 210 and thus a plurality of the sockets 220 may be arranged in series as a socket string in the first direction I, a plurality of the supply line bodies 311 may be arranged alternately with the socket strings in the second direction II.

In addition, since the supply line body 311 may be higher than the socket 220, the supplementary fluid SF injecting from the injector 312 toward the temperature-deviated test object SUT may be slanted with respect to the temperature-deviated test object SUT. For example, the supplementary fluid SF injected from the supply line body 311 may be a slant flow AF1 slanted with respect to the temperature-deviated test object SUT at a slope angle. For example, the injector 312 may include a slant penetration hole on the side surface S1 of the supply line body 311.

In an exemplary embodiment of the inventive concept, a plurality of the injectors 312 may be arranged on the side surface S1 of the supply line body 311 at the same gap distance along the first direction I. Thus, the supplementary fluid SF may be simultaneously injected onto a plurality of the temperature-deviated test objects SUT in the mounting frames 210 of the mounting columns MC. Therefore, the temperature difference may be simultaneously reduced along the mounting columns MC.

Referring to FIG. 4C, the supply line body 311 may be separated into block pieces that are spaced apart from each other by the same gap distance at every rear portion of the socket 220 in the first direction I. Thus, a plurality of supply blocks 315 may be discontinuously positioned at each rear side of the sockets 220 at a height h1 higher than the socket 220. The supply block 315 may be provided on each of the mounting frames 210. For example, each of the supply blocks 315 may be individually positioned at the rear side of the socket 220 corresponding to each mounting frame 210.

For example, as illustrated in FIG. 1, the main fluid line 320 may include an inlet line body 321 for supplying the test fluid TF and an outlet line body 322. The test fluid TF may also be supplied into the main fluid line 320 from a fluid source storing the test fluid TF. The supplementary fluid SF and the test fluid TF may be the same or different from each other. When the supplementary fluid SF and the test fluid TF are the same, the main fluid line 320 and the supplementary fluid line 310 may be connected to a same fluid source. In contrast, when the supplementary fluid SF and the test fluid TF are different from each other, the main fluid line 320 and the supplementary fluid line 310 may be connected to different fluid sources. In an exemplary embodiment of the inventive concept, the test fluid TF and the supplementary fluid SF may be the same fluid.

The inlet line body 321 may be disposed on the base plate 100 in parallel with the mounting frame 210 and substantially perpendicular to the connector 110 in a shape of a slender member continuously extending in the second direction II. Thus, the inlet line body 321 may be arranged as a single line at a rear side of the mounting frame 210 and the test fluid TF may be supplied onto the test object SUT from the inlet line body 321 in the first direction I.

The outlet line body 322 may be arranged on the base plate 100 in parallel with the mounting frame 210 and substantially perpendicular to the connector 110 in a shape of a slender member continuously extending in the second direction II. For example, the outlet line body 322 may be spaced apart by a predetermined distance from the inlet line body 321 in the first direction I, so that the test fluid TF supplied from the inlet line body 321 may pass the test objects SUT disposed between the inlet line body 321 and the outlet line body 322 and then the test fluid TF may be discharged from the test objects SUT through the outlet line body 322. Therefore, a gap space between the inlet body line 321 and the outlet line body 322 may be referred to as a test area where the operational test may be conducted. A flow of the test fluid TF may be generated as a horizontal flow AF2 from the inlet line body 321 to the outlet line body 322. In some exemplary embodiments of the inventive concept, the test objects SUT in the test area may be simultaneously tested in the unit horizontal flow AF2 of the test fluid TF.

Since the inlet line body 321 and the outlet line body 322 may be positioned on the same level, the test fluid TF may flow from the inlet line body 321 to the outlet line body 322 in parallel with the base plate 100 (e.g., in a horizontal direction). For example, the flow of the test fluid TF may be the horizontal flow AF2 between the inlet line body 321 and the outlet line body 322 in the first direction I.

The horizontal flow AF2 may be a test flow for conducting the operational test and the slant flow AF1 may be a supplementary flow for reducing the temperature difference between the test temperature and the actual temperature of each of the test objects SUT.

When a hot burn-in test is conducted on the test objects SUT, the temperature of the test fluid TF may be set to a hot test temperature. The test fluid TF may pass from the inlet line body 321 to the outlet line body 322 as the horizontal flow AF2. Thus, when the temperature of the electronic apparatuses AUT sufficiently reaches the hot test temperature, a test signal may be transmitted to the electronic apparatuses AUT and the operational signals may be generated from the electronic apparatuses AUT. Thereafter, a non-operated electronic apparatus AUT during the hot burn-in test may be sorted out and classified as a defective apparatus by analyzing the received operational signals.

In such a case, since the hot test temperature may be much higher than an operational temperature of each of the test objects SUT and the actual temperature is substantially the same as the hot test temperature, no temperature difference may occur in each of the test objects SUT.

In contrast, when a cold burn-in test is conducted on the test objects SUT, the test fluid TF may be set to a cold test temperature. The test fluid TF may pass from the inlet line body 321 to the outlet line body 322 such as the horizontal flow AF2. Since the operational heat is generated from each of the electronic apparatuses AUT, it may take a longer time for the actual temperature of the test objects SUT to reach the cold test temperature.

In such a case, the actual temperature of each of the test objects SUT may be detected by the temperature sensor 213 and the supplementary fluid SF may be intensively supplied to the temperature-deviated test objects SUT from the supplementary fluid line 310. The supplementary fluid SF may include the slant flow AF1. Therefore, the actual temperature may reach the cold test temperature in a shorter time due to the supplementary fluid SF flowing through the supplementary fluid line 310.

In an exemplary embodiment of the inventive concept, at least a flow compensator 323 may be disposed between the neighboring mounting rows MR in the test area, to improve a temperature uniformity in the test area. Since the inlet line body 321 and the outlet line body 322 may be spaced apart in the first direction I, the horizontal flow AF2 may be interrupted by the test objects SUT mounted in each of the mounting columns MC. Thus, the test fluid TF may be non-uniformly distributed across the whole test area, and thus the temperature of the test objects SUT may not be uniform between the inlet line body 321 and the outlet line body 322.

Thus, the flow compensator 323 may be disposed on the base plate 100 and the flow speed of the horizontal flow AF2 may be controlled in the first direction I in the test area.

Figure 5:
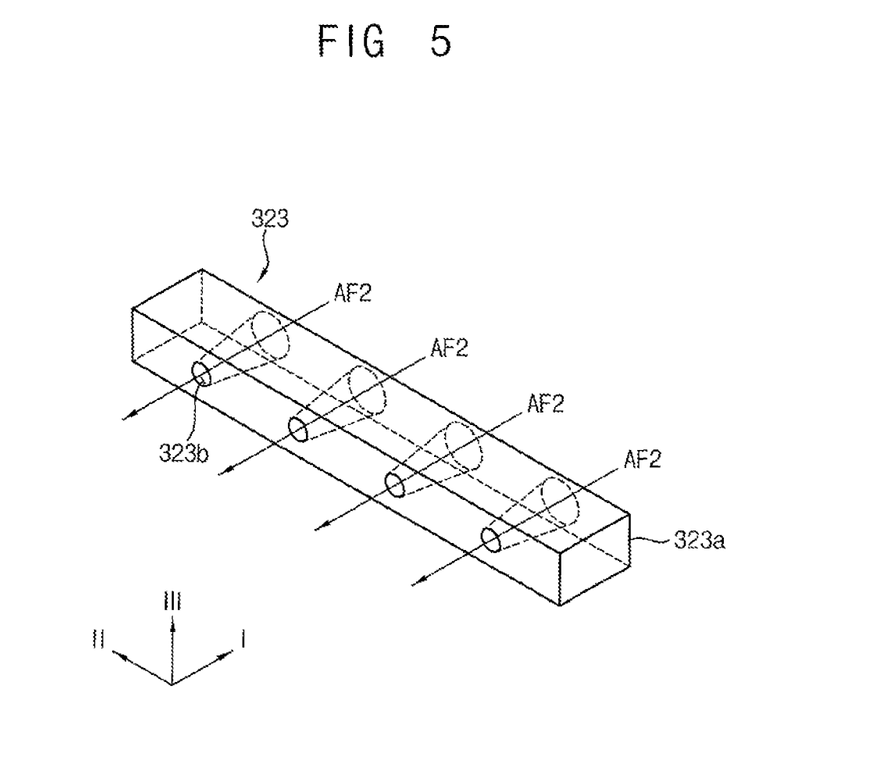
FIG. 5 is a perspective view illustrating a flow compensator of the test board shown in FIG. 1 according to an exemplary embodiment of the inventive concept.

FIG. 5 is a perspective view illustrating the flow compensator of the test board shown in FIG. 1.

Referring to FIG. 5, the flow compensator 323 may include a slender body 323a extending in the second direction II and positioned between the neighboring columns MC and a plurality of orifices 323b penetrating through the slender body 323a in the first direction I. For example, a cross-sectional area of each of the orifices 323b may decrease along the first direction I so that the cross-sectional area of the orifice 323b facing the inlet line body 321 may be larger than that of the orifice 323b facing the outlet line body 322. Thus, since flowing in the first direction I, the horizontal flow AF2 may accelerate when penetrating through the orifice 323b of the flow compensator 323. Thus, the test fluid TF may be uniformly distributed on the test objects SUT in the test area. In addition, the temperature uniformity of the test objects SUT may be sufficiently increased due to the flow compensator 323.

In an exemplary embodiment of the inventive concept, the flow compensator 323 may include a first compensator 3231 relatively close to the inlet line body 321 and a second compensator 3232 relatively close to the outlet line body 322. However, the number of the flow compensator 323 may vary according to a size of the test area and a density of the test objects SUT in the test area.

In an exemplary embodiment of the inventive concept, the test fluid TF may be supplied into the test area from the inlet line body 321 at a constant inlet speed and may be discharged from the test area through the outlet line body 322 at a constant outlet speed. In such a case, the speed gradient of the test fluid TF may be relatively linear in contrast with the scenario that no flow compensator is arranged in the test area. The linear speed gradient of the test fluid TF in the first direction I may improve the temperature uniformity of the test objects SUT disposed in a same mounting column MC.

In an exemplary embodiment of the inventive concept, the inlet speed of the test fluid TF may be in a range of about 5 m/s to about 10 m/s and the outlet speed of the test fluid TF may be in a range of about 3 m/s to about 6 m/s.

In an exemplary embodiment of the inventive concept, the fluid controller 400 may be positioned at an exterior surface of the base plate 100 and may reduce the temperature difference of the temperature-deviated test objects SUT in a shorter time.

For example, the fluid controller 400 may include a detection controller 410 for controlling the temperature sensor 213 to detect the actual temperature of each of the test objects SUT, a temperature operator 420 for calculating and obtaining the temperature difference between the actual temperature and the test temperature of the operational test for each of the test objects SUT, an object selector 430 selecting a particular test object SUT as a temperature-deviated test object SUT when the temperature difference of the particular test object SUT is out of the allowable temperature range, and a driver 440 for driving the supplementary fluid line 310 to supply the supplementary fluid SF onto the temperature-deviated test object SUT until the temperature difference may be reduced to be within the allowable range.

Thus, when the temperature-deviated test object SUT is selected by the fluid controller 400, the supplementary fluid SF may be intensively onto the temperature-deviated test object SUT, and thus the temperature difference may be rapidly reduced to be within the allowable range or may be eliminated. For example, a surface temperature of the temperature-deviated test objects SUT may reach the test temperature in the operational test in a much shorter time, thereby increasing the test efficiency of the operational test.

The detection controller 410 and the driver 440 may be connected to the temperature sensor 213 and the supplementary fluid line 310, respectively, by a wired communication line (e.g., cable, fiber-optic communication) or a wireless communication line. Thus, the temperature difference of the test objects SUT may be instantaneously detected and reduced to be within the allowable ranges by the fluid controller 400.

In some cases, the temperature of the test objects SUT may reach the test temperature in a shorter time in spite of the operational heat of the electronic apparatuses AUT in the cold burn-in test.

According to an exemplary embodiment of the inventive concept, the cold burn-in test may be conducted on the test board 500 as well as the hot burn-in test without changing the test chamber. In some cases, when the cold burn-in test is conducted, the temperature-deviated test objects SUT may rapidly reach the test temperature of the cold burn-in test in spite of the operational heat of the electronic apparatuses AUT of the temperature-deviated test objects SUT. The temperature sensor 213 may be disposed on each of the test objects SUT and the actual temperature of the test objects SUT may be detected in real time by the temperature sensor 213. Thus, the temperature difference between the actual temperature and the cold test temperature may be instantaneously obtained together with selecting the temperature-deviated test object SUT. Then, the temperature difference may be rapidly reduced or eliminated by supplying the supplementary fluid SF onto the temperature-deviated test object SUT.

Figure 6:
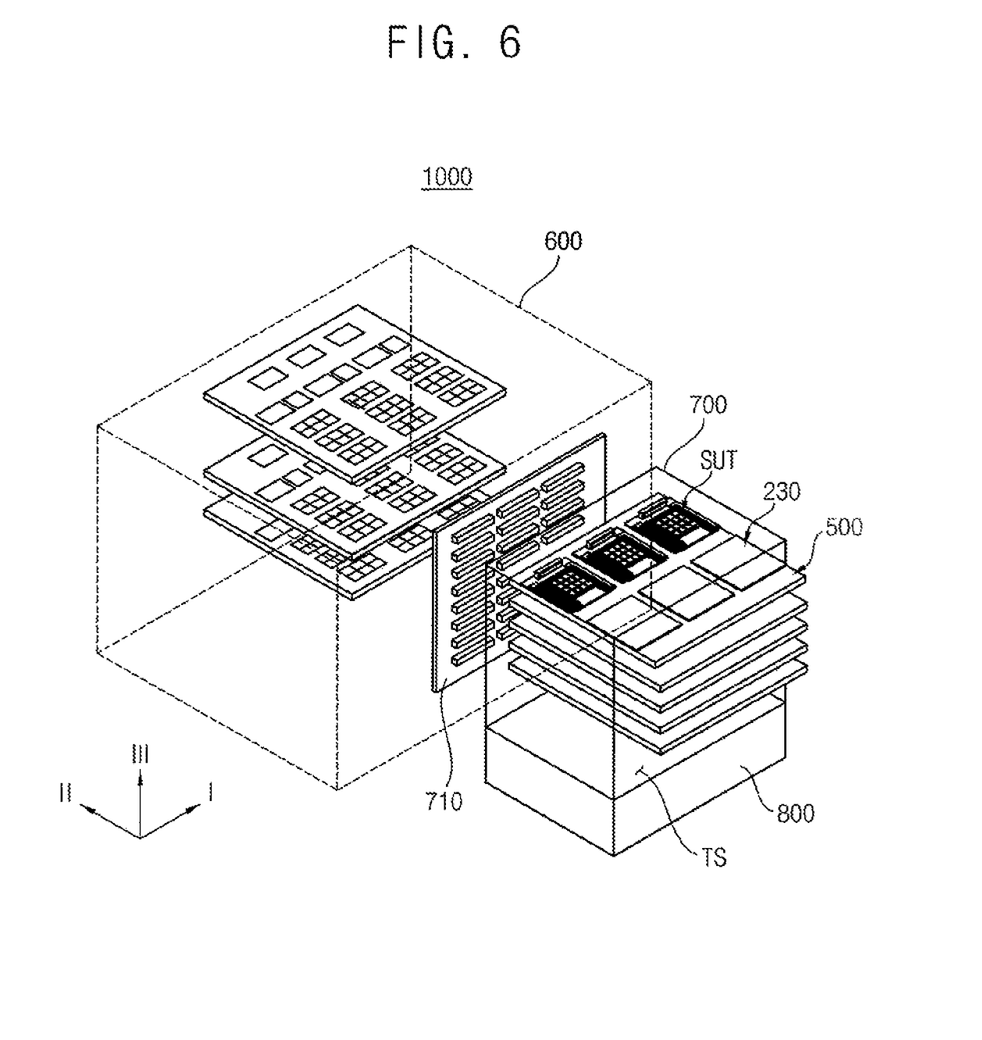
FIG. 6 is a perspective view illustrating a test apparatus including the test board shown in FIG. 1 according to an exemplary embodiment of the inventive concept.

FIG. 6 is a perspective view illustrating a test apparatus including the test board shown in FIG. 1 according to an exemplary embodiment of the inventive concept.

Referring to FIG. 6, a test apparatus 1000 may include a test head 600, a test chamber 700, a circulator 800 and a test board 500.

For example, the test head 600 may generate the test signal for testing the test objects SUT and may detect the operational signals generated from the test objects SUT in response to the test signal. The operational signals may be analyzed and a defective object may be sorted out from the test objects SUT in the test head 600. Therefore, the test head 600 may include various electronic devices and instruments for generating the test signal and detecting and analyzing the operational signals.

The test chamber 700 may be shaped into a cubic structure having a closed test space TS therein and may include a connector plate 710 that is connected to the test head 600. Thus, the test objects SUT may be disposed in the test space TS and the operational test may be conducted under a predetermined test temperature.

A plurality of protrusions (not shown) may be disposed on an inner side of the test chamber 700 by the same gap in a third direction III perpendicular to the first direction I and the second direction II. The gap space between the neighboring protrusions may be used as a slot space for receiving the test board 500.

The test board 500 may be inserted into the slot space and may be supported by each pair of the protrusions in the test chamber 700. Lateral opposite edge portions of the test board 500 may be positioned on a pair of the protrusions facing each other in the test chamber 700. Thus, a plurality of the test boards 500 may be placed in the test chamber 700. The connector 110 of the test board 500 may be connected to the connector plate 710, and thus the test head 600 and the test board 500 may be electrically connected with each other.

A plurality of the test objects SUT may be mounted on the test board 500 and each of the test objects SUT may include a plurality of the electronic apparatuses AUT on the array circuit board ACB. Each test board 500 may include its own connector 110 and the temperature difference may be individually reduced or eliminated by supplementary supply of the test fluid TF.

In FIG. 6, the test board 500 may have substantially the same configurations and structures as the test board 500 as described in detail with reference to FIGS. 1 to 5. Thus, the same reference numerals denote the same elements in FIGS. 1 to 5, and any further detailed descriptions on the same elements will be omitted hereinafter.

A plurality of the test boards 500 may be stacked at a central portion of the test chamber 700 and both side portions of the test chamber 700 may be provided as a flow space for the test fluid TF and/or the supplementary fluid SF. Most of the central portion of the test chamber 700 may be provided as the test space TS. Thus, the test fluid TF and/or the supplementary fluid SF may flow into the test space TS from a first side portion and may flow out of the test space TS to a second side portion of the test chamber 700.

The circulator 800 may be disposed at a lower portion of the test chamber 700 for circulating the test fluid TF and/or the supplementary fluid SF via the test space TS. The circulator 800 may be connected to both side portions of the test chamber 700 and may circulate the test fluid TF and/or the supplementary fluid SF through the first side portion, the test space TS and the second side portion of the test chamber 700. For example, the circulator 800 may include at least a reservoir for storing the test fluid TF and/or the supplementary fluid SF, a driving pump and a temperature adjustor such as a heater and a cooler. The test fluid TF and/or the supplementary fluid SF may be heated or cooled down by the temperature adjustor.

When the test fluid TF flows into the first side portion of the test chamber 700 by the circulator 800, the test fluid TF may be supplied into the test space TS and flow over the test objects SUT until the surface temperature of the test objects SUT reaches the test temperature uniformly. The test fluid TF passing the test space TS may flow into the second side portion of the test chamber 700 and then may be stored again in the reservoir of the circulator 800. When the surface temperature of the test objects SUT is sufficiently below the test temperature, the operational test such as the hot or cold burn-in test may be conducted on the test objects SUT. The supplementary fluid SF may operate in substantially the same way as the test fluid TF.

In an exemplary embodiment of the inventive concept, the test apparatus 1000 may include a burn-in test apparatus in which the cold burn-in test may be conducted as well as the hot burn-in test in the test chamber 700. Thus, the test fluid TF may be controlled to be a hot fluid or a cold fluid by the circulator 800.

For example, the test fluid TF may be set to a hot fluid for the hot burn-in test in which a hot temperature may range from about 150° C. to about 250° C. The test fluid TF may also be set to a cold fluid for the cold burn-in test in which a cold temperature may range from about −10° C. to about −40° C.

According to an exemplary embodiment of the inventive concept, a plurality of test objects may be mounted on the test board 500, the test board 500 may be stacked on the test chamber, and the cold test may be conducted in the test chamber 700 as well as the hot test. The test fluid TF may flow over the test objects SUT and may circulate in the test chamber 700 by the circulator 800.

Each of the test objects SUT may include an array circuit board ACB and a plurality of electronic apparatuses AUT on the array circuit board ACB and the temperature sensor 213 may be disposed on the array circuit board ACB. The actual temperature may be detected by the temperature sensor 213. In addition, the temperature difference between the actual temperature and the test temperature may be automatically obtained along with the temperature-deviated test object. Then, the test fluid TF may be intensively injected onto the temperature-deviated test object until the temperature difference may be rapidly reduced to be within the allowable range or may be eliminated, thereby increasing the efficiency and the reliability of the operational test conducted on the electronic apparatuses.

While the inventive concept has been particularly shown and described with reference to the exemplary embodiments thereof, it will be understood by one of ordinary skill in the art that variations in form and detail may be made therein without departing from the spirit and scope of the inventive concept as defined by the following claims.

What is claimed is:

1. A test board for mounting a plurality of test objects, comprising:
    a base plate including at least a connector and a plurality of mounting areas in a matrix shape having at least a mounting row in a first direction and at least a mounting column in a second direction substantially perpendicular to the first direction;
    a plurality of test units arranged on the mounting areas of the base plate, respectively, and a test object is mounted in each of the mounting areas for an operational test; and
    a fluid supplier including a main fluid line and a supplementary fluid line,
    wherein the fluid supplier is disposed on the base plate and supplies a test fluid via the main fluid line to each of the test units for the operational test having a test temperature and a supplementary fluid via the supplementary fluid line to the test object to reduce a temperature difference between an actual temperature of the test object and the test temperature such that the actual temperature of the plurality of test objects is substantially below the test temperature,
    wherein the supplementary fluid line is disposed on the base plate and extends in the first direction alternately with the mounting row,
    wherein the main fluid line is disposed on the base plate and extends in the second direction,
    wherein each of the test units includes:
        a mounting frame arranged in the mounting area of the base plate and holding the test object; and
        a socket arranged on the base plate and is connected to the connector such that the test object is combined with the socket and is connected to the connector via the socket in the operational test,
    and wherein the mounting frame includes:
        a support plate on the base plate; and
        a pair of holding members arranged on peripheral portions of the support plate and are spaced apart in the first direction such that the holding members are shaped into a slender bar extending in the second direction and the test object is mounted on the holding members.

2. The test board of claim 1, wherein the support plate is configured to have a size larger than the test object such that the support plate is partially exposed at an end portion to dissipate an operational heat of the test object.

3. A test board for mounting a plurality of test objects, comprising:
    a base plate including at least a connector and a plurality of mounting areas in a matrix shape having at least a mounting row in a first direction and at least a mounting column in a second direction substantially perpendicular to the first direction;
    a plurality of test units arranged on the mounting areas of the base plate, respectively, and a test object is mounted in each of the mounting areas for an operational test; and
    a fluid supplier including a main fluid line and a supplementary fluid line,
    wherein the fluid supplier is disposed on the base plate and supplies a test fluid via the main fluid line to each of the test units for the operational test having a test temperature and a supplementary fluid via the supplementary fluid line to the test object to reduce a temperature difference between an actual temperature of the test object and the test temperature such that the actual temperature of the plurality of test objects is substantially below the test temperature,
    wherein the supplementary fluid line is disposed on the base plate and extends in the first direction alternately with the mounting row such that the supplementary fluid is supplied onto the test object in the second direction from the supplementary fluid line as a slant flow slanted with respect to the test object,
    wherein the main fluid line is disposed on the base plate and extends in the second direction such that the test fluid is supplied onto the test object in the first direction from the main fluid line as a horizontal flow substantially horizontal with respect to the test object, and
    wherein each of the test units includes:
        a mounting frame arranged in the mounting area of the base plate and holding the test object; and
        a socket arranged on the base plate and is connected to the connector such that the test object is combined with the socket and is connected to the connector via the socket in the operational test.

4. The test board of claim 3, wherein the supplementary fluid line includes:
    a supply line body disposed at a rear portion of the socket with a height higher than the socket and is shaped into a continuous line extending in the first direction; and
    a plurality of injectors slantly arranged at a side surface of the supply line body toward the test objects such that the supplementary fluid is injected onto the test objects from the injectors at a slant angle.

5. The test board of claim 3, wherein the supplementary fluid line includes:
    a plurality of supply blocks discontinuously positioned at each rear side of the sockets corresponding to each mounting frame with a height higher than the socket and are spaced apart from each other by a same gap distance in the first direction; and
    a plurality of injectors slantly arranged at a side surface of each of the supply blocks toward the test objects such that the supplementary fluid is injected onto the test objects from the injectors at a slant angle.

6. The test board of claim 3, wherein the main fluid line includes:
    an inlet line body arranged on the base plate in parallel with the mounting frame in a shape of a slender member extending in the second direction and supplying the test fluid onto the test objects; and
    an outlet line body spaced apart from the inlet line body on the base plate in the first direction in a shape of a slender member continuously extending in the second direction and discharging the test fluid from the test objects to generate a horizontal flow from the inlet line body to the outlet line body.

7. The test board of claim 6, wherein the main fluid line further includes at least a flow compensator arranged on the base plate between the inlet line body and the outlet line body and extending in the second direction such that the flow compensator is interposed between the neighboring mounting columns in parallel with the inlet line body and the outlet line body to control a speed of the horizontal flow.

8. The test board of claim 7, wherein the flow compensator includes a slender body extending in the second direction and is positioned between the neighboring columns, and a plurality of orifices penetrating through the slender body such that a cross-sectional area of each orifice decreases in the first direction.

9. The test board of claim 3, wherein the test object includes an array circuit board having a plurality of circuit boards connected to each other, a plurality of electronic apparatuses under test mounted on the array circuit board and connected to the array circuit board, and a temperature sensor arranged on the array circuit board and detecting a surface temperature of the test object.

10. The test board of claim 9, further comprising a fluid controller obtaining the temperature difference and controlling the supplementary fluid to flow onto the test object until the surface temperature of the test object reaches the test temperature.

11. The test board of claim 10, wherein the fluid controller includes:
a detection controller controlling the temperature sensor to detect the actual temperature of each test object;
a temperature operator calculating a temperature difference between the actual temperature and the test temperature of the operational test and obtaining the temperature difference of each test object;
an object selector selecting a particular test object as a temperature-deviated test object when the temperature difference of the particular test object is out of an allowable temperature range; and
a driver driving the supplementary fluid line to supply the supplementary fluid onto the temperature-deviated test object until the temperature difference is reduced to be within the allowable range.

12. A test apparatus for conducting an operational test on a plurality of test objects, comprising:
a test head including electronic instruments that generates a test signal for testing the test objects and detects and analyzes operational signals generated from the test objects in response to the test signal;
a plurality of test boards on each of which the tests objects are mounted in a matrix shape such that each of the test boards includes a connector and supplies a supplementary fluid for reducing a temperature difference of the test objects as well as a test fluid for conducting the operational test; and
a test chamber including a connector plate that is connected to the test head and a plurality of the connectors of the test boards and receiving a plurality of the test boards such that the operational test is conducted on each of the test objects under a test temperature, and
wherein each of the plurality of test boards for mourning the test objects further comprises:
a base plate including the connector and a plurality of mounting areas in a matrix shape having at least a mounting row in a first direction and at least a mounting column in a second direction substantially perpendicular to the first direction;
a plurality of test units arranged on the mounting areas of the base plate, respectively, and a test object is mounted in each of the mounting areas for the operational test such that each of the plurality of the test units includes a mounting frame disposed in the mounting area of the base plate and holding the test object and a socket arranged on the base plate and is connected to the connector and the test object; and
a fluid supplier including a main fluid line and a supplementary fluid line, and
wherein the fluid supplier is disposed on the base plate and supplies the test fluid via the main fluid line to each of the plurality of test units for the operational test having the test temperature and the supplementary fluid via the supplementary fluid line to the test object to reduce a temperature difference between an actual temperature of the test object and the test temperature such that the actual temperature of the test objects is substantially below the test temperature, and
wherein the supplementary fluid line is disposed on the base plate and extends in the first direction alternately with the mounting row such that the supplementary fluid is supplied onto the test object in the second direction from the supplementary fluid line as a slant flow slanted with respect to the test object, and the main fluid line is disposed on the base plate and extends in the second direction such that the test fluid is supplied onto the test object in the first direction from the main fluid line as a horizontal flow substantially horizontal with respect to the test object.

13. The test apparatus of claim 12, wherein the supplementary fluid line includes:
a supply line body arranged at a rear portion of the socket with a height higher than the socket and shaped into a continuous line extending in the first direction; and
a plurality of injectors slantly arranged at a side surface of the supply line body toward the test objects such that the supplementary fluid is injected onto the test objects from the injectors at a slant angle.

14. The test apparatus of claim 12, wherein the main fluid litre includes:
an inlet line body arranged on the base plate in parallel with the mounting frame in a shape of a slender member extending in the second direction and supplying the test fluid onto the test objects; and
an outlet line body spaced apart from the inlet line body on the base plate in the first direction in a shape of a slender member continuously extending in the second direction and discharging the test fluid from the test objects to generate a horizontal flow from the inlet line body to the outlet line body.

15. The test apparatus of claim 14, wherein the main fluid line further includes at least a flow compensator arranged on the base plate between the inlet line body and the outlet line body and extending in the second direction such that the flow compensator is interposed between the neighboring mounting columns in parallel with the inlet line body and the outlet hoe body to control a speed of the horizontal flow.

16. The test apparatus of claim 12, wherein the test object includes an array circuit board having a plurality of circuit boards connected to each other, a plurality of electronic apparatuses under test mounted on the array circuit board and connected to the array circuit board and a temperature sensor arranged on the array circuit board and detecting a surface temperature of the test object.

17. The test apparatus of claim 16, the test board further includes a fluid controller obtaining the temperature difference and controlling the supplementary fluid to flow onto the test object until the surface temperature of the test object reaches the test temperature.

\* \* \* \* \*